(12) United States Patent
Wang et al.

(10) Patent No.: US 7,020,022 B1
(45) Date of Patent: Mar. 28, 2006

(54) METHOD OF REFERENCE CELL DESIGN FOR OPTIMIZED MEMORY CIRCUIT YIELD

(75) Inventors: John Wang, San Jose, CA (US); Zhigang Wang, Santa Clara, CA (US); Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 10/887,782

(22) Filed: Jul. 9, 2004

(51) Int. Cl.
*G11C 16/00* (2006.01)

(52) U.S. Cl. .................................... 365/185.2; 365/210
(58) Field of Classification Search ................ 365/210, 365/185.2
See application file for complete search history.

(56) References Cited

U.S. PATENT DOCUMENTS 5,737,260 A * 4/1998 Takata et al. ................ 365/145

* cited by examiner

*Primary Examiner*—Tan T. Nguyen

(57) ABSTRACT

A method for standard reference cell design is herein disclosed. The method includes determining a first number of individual bits to be employed in a standard reference cell design based on the number of individual bits that are included in core memory cells that are to be measured using the standard reference cell. The method further includes determining a range of variation in the core memory cells to be measured that is due to process variation in the generation of the core memory cells. In addition, the method includes determining an additional number of individual bits to be included in the standard reference cell design based on the determined range of variation. A standard reference cell that includes a number of individual bits equal to the sum of both the first and the additional number of individual bits is generated.

27 Claims, 3 Drawing Sheets

METHOD OF REFERENCE CELL DESIGN FOR OPTIMIZED MEMORY CIRCUIT YIELD

FIELD OF THE INVENTION

The present invention relates generally to a method of reference cell design. In particular, an embodiment of the present invention relates to a method of reference cell design for optimized memory yield.

BACKGROUND OF THE INVENTION

Non-volatile semiconductor memory devices are fundamental components of conventional computer systems design. The basic unit of a memory device is the memory cell. The memory cell is the primary mechanism by which data is stored in non-volatile memory devices. Many conventional memory systems can accommodate a maximum storage capacity of one bit per cell that can assume two possible states. It should be appreciated that semiconductor memory cells having more than two possible states are known in the prior art.

A conventional flash memory cell may be comprised of a single field effect transistor (FET) which includes a select gate, a floating gate, a source, and a drain. Information is stored in the flash cell by altering the amount of charge on the floating gate, which causes the threshold voltage of the flash memory cell to be varied. The flash memory cell is read by applying a select voltage via a wordline that is coupled to the select gate. The amount of current that the flash memory cell conducts when the select voltage is applied to the wordline is determined by the threshold voltage of the flash cell.

In theory a flash cell memory can possess a separate identifiable state for each electron that is placed on the floating gate. In practice, however, conventional flash memory cells most often may assume only two possible states because of flash memory cell structure inconsistencies, memory cell differences in charge loss over time, thermal considerations and inaccuracies in sensing the charge on the floating gate that affect the ability to determine the data stored in the flash memory cell. The two states that may be assumed are generally termed "programmed" and "erased," and each state corresponds to a specified range of voltages.

In order to distinguish between the two possible states, the states are separated by a range of separation voltages. When a flash cell is read, the threshold voltage of the flash cell is compared to the threshold voltage of a reference flash cell that has a threshold voltage that is set in the separation range. A single comparator is generally employed to make the comparison between the memory cell voltage and the reference cell voltage and to output the result. If the flash cell is programmed, excess electrons are trapped on the floating gate, and the threshold voltage of the flash cell is increased to the point where the selected flash cell conducts less drain-source current than the reference flash cell. The programmed state of the prior flash cell is typically indicated by a logic 0. If the prior flash cell is erased, little or no excess electrons are on the floating gate, and the flash cell conducts more drain-source current than the reference cell. The erased state of the prior flash cell is typically indicated by a logic 1. In this manner the voltages present in a memory cell may be distinguished.

Assuming that the flash cell is initially in the erased state, the flash cell is programmed by placing charge on the floating gate such that the threshold voltage $V_t$ of the flash cell is increased. Conventional flash cells are programmed via hot electron injection through the application of a source voltage to the source of the flash cell, a programming voltage to the drain of the flash cell, and a cell selection voltage to the select gate of the flash cell that is adequate to change the amount of charge stored by the flash cell. The source voltage is typically the system ground voltage. The programming operation is typically controlled by system control electronics or a state machine. Other memory technologies may be employed to program the memory cell by varying the amount of charge that is stored in the memory cell.

Conventionally write verify schemes are employed to monitor the amount of charge stored in the floating gate of the flash cell when programming the flash cell to insure that the flash cell is, in fact, placed in the "programmed" state and contains the appropriate amount of charge. Write verify schemes typically involve a series of write and read operations in which the flash cell is alternately written to and read from in order to determine whether the cell has been programmed appropriately. One prior art write verify scheme performs the read operation using a program verify reference cell having its $V_t$ set to a voltage that defines the programmed state of the flash cell. Over programming is typically not a concern because there are no states beyond the programmed state for single-bit flash cells.

Standard reference cells allow the comparison of a value present in a memory cell with a value stored in the standard reference cell. Ideally the standard reference cell is chosen to be as close in terms of the characteristics that it exhibits to the memory cell that it measures as is possible. In the memory manufacturing process manufactured memory lots may exhibit characteristics that vary from lot to lot. In some cases the variation may be the result of process variation (e.g., such as implantation process etc.). Process variation may cause critical parameters such as the source resistance shown to differ in manufactured memory lots. It should be appreciated that differences in source resistance may affect the amount of charge or current that may be maintained in a memory cell. In some cases the source resistances shown by acceptable memories may vary by 10% or more. Conventional methodologies do not compensate for such variation in acceptable source resistance and many satisfactory memories are unnecessarily discarded.

SUMMARY OF THE INVENTION

A method for standard reference cell design is herein disclosed. The method includes determining a first number of individual bits to be employed in a standard reference cell design based on the number of individual bits that are included in core memory cells that are to be measured using the standard reference cell. The method further includes determining a range of variation in the core memory cells to be measured that is due to process variation in the generation of the core memory cells. In addition, the method includes determining an additional number of individual bits to be included in the standard reference cell design based on the determined range of variation. A standard reference cell that includes a number of individual bits equal to the sum of both the first and the additional number of individual bits is generated.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

OPTIMIZED REFERENCE CELL TO COMPENSATE FOR PROCESS VARIATION

Figure 1:
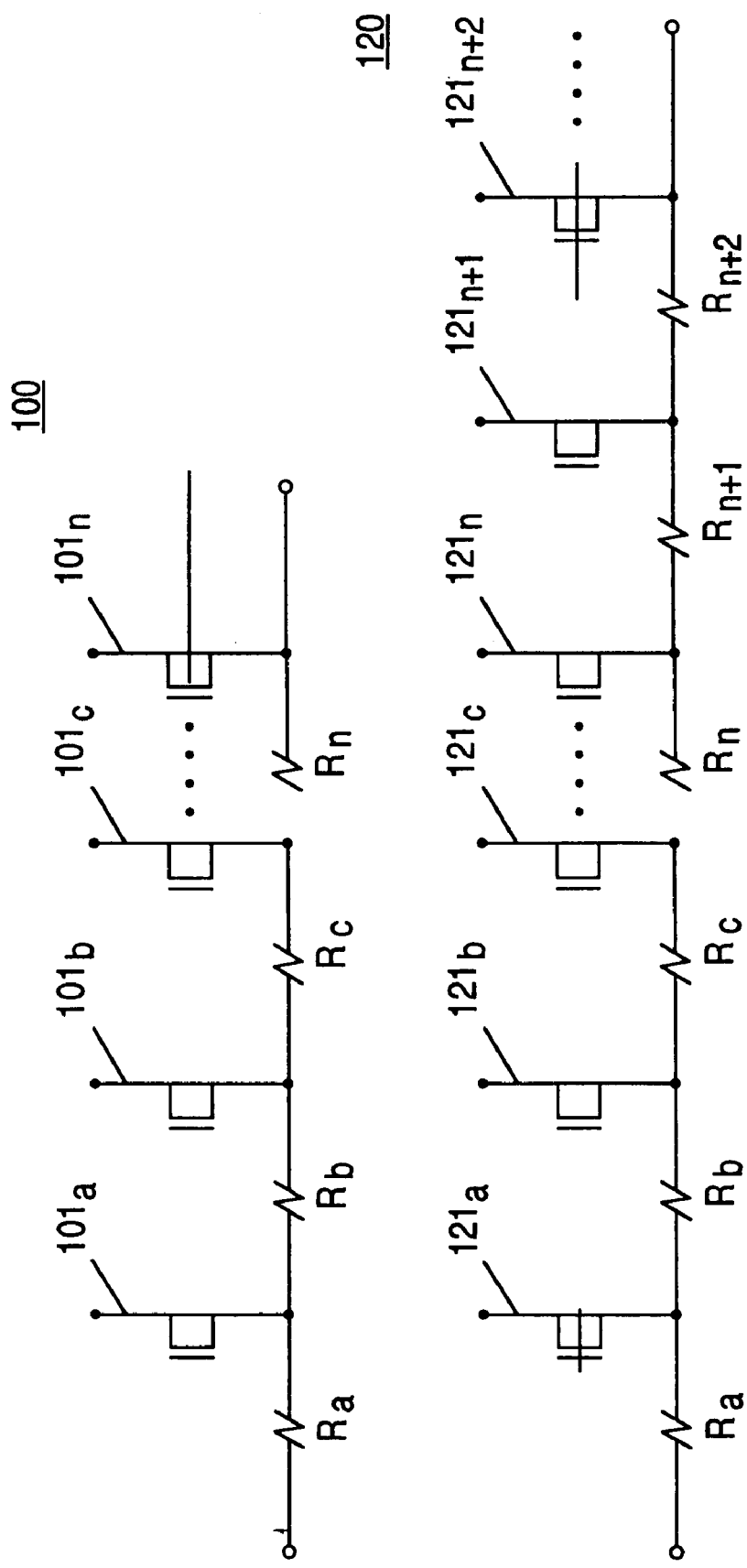
FIG. 1 shows a standard reference cell according to one embodiment of the present invention.

FIG. 1 shows a core memory cell 100 and a standard reference cell 120 according to one embodiment of the present invention. The standard reference cell 120 shown in FIG. 1 employs a configuration that compensates for acceptable core memory cell 100 variation that results from process variation that may occur in the fabrication of memory (e.g., flash etc.) circuits. Such a configuration allows a variation within normal ranges of the resistances shown by core memory cells (e.g., 100) that are measured by a standard reference cell (e.g., 120) in a verification process. FIG. 1 shows core memory cell 100 and standard reference cell 120.

Core memory cell 100 may include bits (e.g. transistors, individual cells) $101a$–$101n$ and source resistances Ra–Rn. According to one embodiment, the core memory cell may include but is not limited to flash memory cells. It should be appreciated that the current capacity of a memory cell varies with the source resistance of the memory cell. It should be appreciated that during the fabrication process some core memory cells may derive characteristics that are different from other core memory cells. The reason for the variation may include but is not limited to such process variations as the type of implantation process that is employed etc.

Source resistances may vary as a result of process variation. According to one embodiment, there may be as much as a 10% range of variation in the acceptable source resistances exhibited by normally functioning core memory cells produced in a manufacturing process. In other embodiments other ranges of acceptable source resistances of normally functioning core memory cells may be observed. The source resistance of a cell may determine the current that can be stored by that cell and thus the amount of voltage that may be stored by the cell. Consequently, a variation in the voltage capacity of memory cells may result from source resistance variation. The voltage levels stored in the core memory cells are compared to the voltage levels stored in standard reference cells for verification purposes.

Standard reference cell 120 may include bits (e.g., transistors, individual cells) $121a$–$121n+2$ and source resistances Ra–Rn+2 such as is shown in FIG. 1. Ideally a standard reference cell (e.g., 120) is constructed to exhibit characteristics as close as is possible to a core memory cell (e.g., 100) that it measures. According to one embodiment of the present invention, the number of individual memory cells (e.g., bits, transistors) of a standard reference cell 120 that show a total resistance that is equal to the worst acceptable process variation case of a batch of memory cells (e.g., 100) to be verified is employed in the construction of the standard reference cell 120. For example, consider the case where the storage capacity of packages of 20 bit core memory cells (e.g., 100) are to be verified (e.g., n equals 20 in FIG. 1). If the worst acceptable source resistance variation case seen in the memory cell packages is found to be 10% then 2 additional bits (e.g., n plus 2 or 10% of 20 to add 10% more source resistance to the 20 bit reference cell) or 22 total bits may be employed in the construction of the standard reference cell (e.g., 120) to accommodate this range of acceptable variation (see FIG. 1).

By accommodating a range of acceptable variation, a verification process utilizing a standard reference cell that compensates for acceptable process variation may qualify as "acceptable" satisfactory memory cells that fall within the range. These acceptable memory cells may otherwise be excluded because of the variation that they exhibit. It should be appreciated that this process of accommodation results in the optimization of the yield of acceptable memory cells (e.g., 100) by rendering satisfactory these otherwise excludable memory cells.

Figure 2:
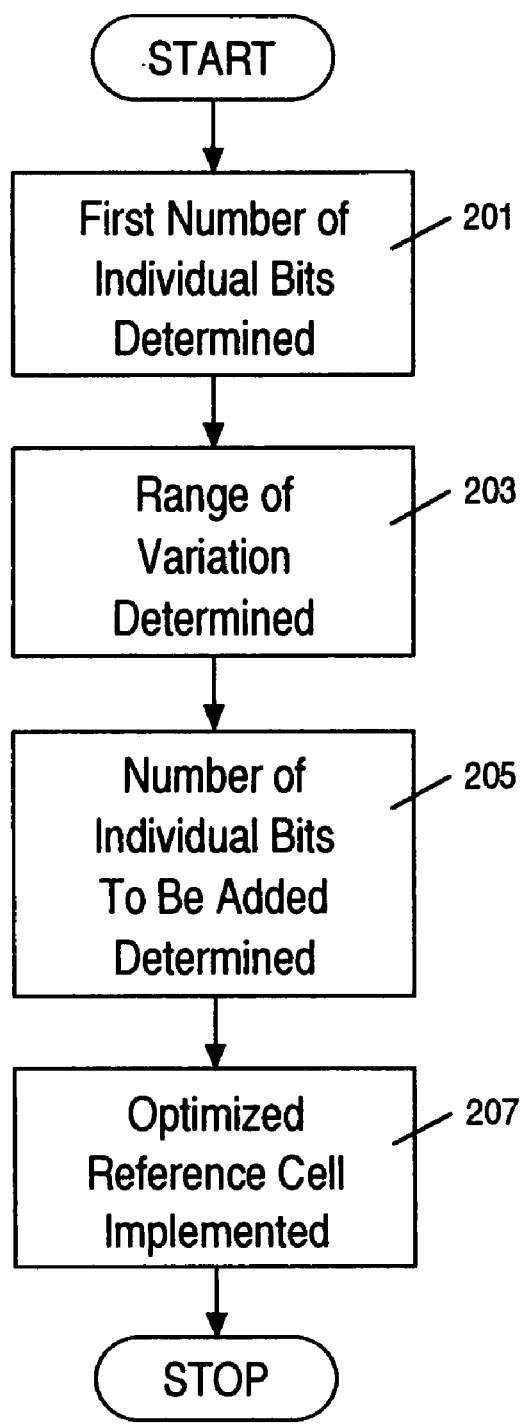
FIG. 2 shows flowchart of a steps performed in a process for generating a reference cell that provides optimized core memory yield according to one embodiment of the present invention.

FIG. 2 shows a process for generating a reference cell that provides optimized core memory yield according to one embodiment of the present invention.

At step 201, a first number of individual bits (e.g., transistors, individual cells) to be employed in a standard reference cell design (e.g., 120) is determined. At step 203, a range of acceptable variation of memory cell characteristics (e.g., source resistance) that results from process variation is determined in devices to be monitored for acceptability. This may be accomplished through such procedures as product analysis, testing, sampling etc.

At step 205, a number of additional bits to be employed in the standard reference cell design is determined. The range of variation determined at step 203 determines the number of additional bits that may be employed in the construction of a standard reference cell (e.g., 120). As previously mentioned, by accommodating a range of process variation, a verification methodology employing a reference cell that compensates for process variation may qualify as "acceptable" those satisfactory memory cells that may otherwise be rejected or excluded. And, at step 207, a reference cell is implemented having the number of bits determined in steps 201 and 205.

Figure 3:
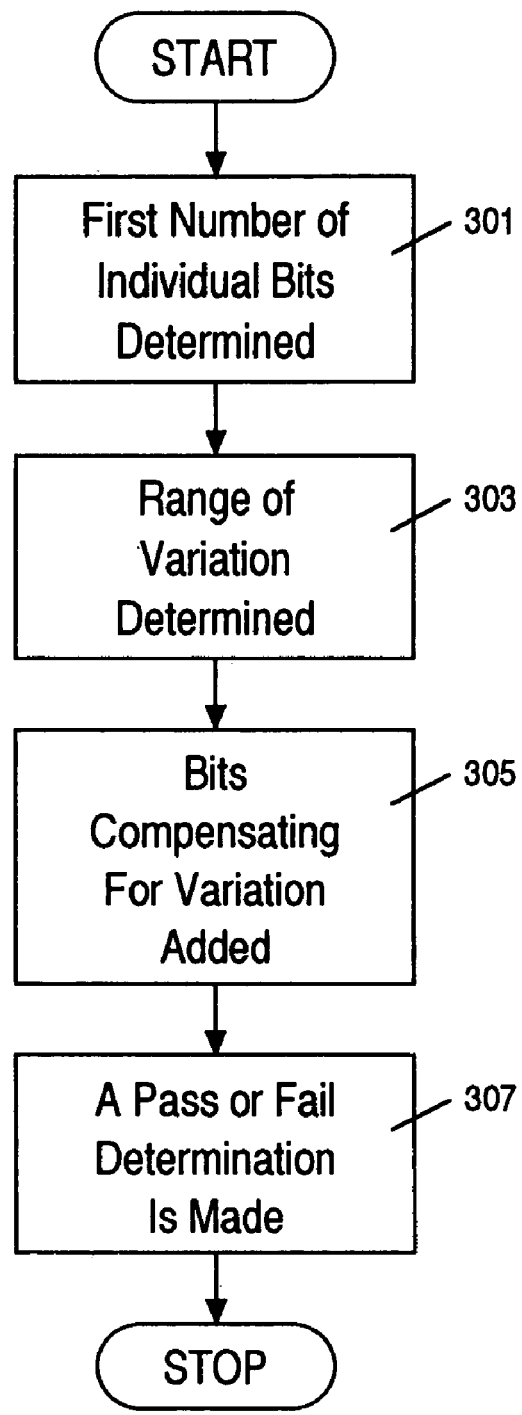
FIG. 3 shows a flowchart of steps performed in a verification process that utilizes a reference cell to provide optimized core memory circuit yield according to one embodiment of the present invention.

FIG. 3 shows a flowchart of a verification process that utilizes a reference cell to provide optimized core memory circuit yield according to one embodiment of the present invention.

At step 301, a first number of individual bits (e.g., transistors, individual cells) to be employed in a reference cell design is determined. At step 303, a range of acceptable variation (e.g., source resistance) in core memory cells (e.g., 100) to be subjected to a verification process is determined. As previously discussed, this may be accomplished through such procedures as product analysis, testing, sampling etc. At step 305, additional bits that compensate for the variation determined in step 303 are added to the cell package of the standard reference cell (e.g., 120). And, at step 307, a pass fail determination based on a verification process carried out utilizing a standard reference cell that includes the additional bits added in step 305 is made.

Thus, a method for standard reference cell design is herein disclosed. The method includes determining a first number of individual bits to be employed in a standard reference cell design based on the number of individual bits that are included in core memory cells that are to be measured using the standard reference cell. The method further includes determining a range of variation in the core memory cells to be measured that is due to process variation in the generation of the core memory cells. In addition, the method includes determining an additional number of individual bits to be included in the standard reference cell design based on the determined range of variation. A standard reference cell that includes a number of individual bits equal to the sum of both the first and the additional number of individual bits is generated.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for standard reference cell generation comprising:
   determining a first number of individual reference cells to be employed in a standard reference cell design based on memory cells to be measured;
   determining a range of variation due to process variation in the generation of said memory cells to be measured;
   determining an additional number of individual reference cells to be included in said standard reference cell design based on said range of variation; and
   generating a standard reference cell that includes a number of individual reference cells equal to the sum of said first and said additional number of individual reference cells.

2. The method of claim 1, wherein said variation is caused by differences in implantation process.

3. The method of claim 2, wherein said variation is caused by a difference in source resistance shown by said memory cells.

4. The method of claim 3, wherein said source resistance varies by as much as 10 percent.

5. The method of claim 3, wherein the current capacity of said memory cells vary with said source resistance.

6. The method of claim 5, wherein a memory cell comprises a transistor.

7. The method of claim 1, wherein said memory cells are flash memory cells.

8. A method for standard reference cell design:
   determining a first number of individual bits to be employed in a standard reference cell design based on the number of individual cells that are contained in core memory cells to be measured;
   determining a worst case variation due to process variation in the generation of said core memory cells to be measured;
   determining an additional number of individual bits to be included with said first number of individual bits in said standard reference cell design based on said worst case variation; and
   generating a standard reference cell that includes a number of individual bits equal to the sum of said first number of individual bits and said additional number of individual bits.

9. The method of claim 8, wherein said variation is caused by differences in an implantation process that is employed in the manufacture of said core memory cells.

10. The method of claim 9, wherein said variation is caused by a difference in the source resistances shown by said core memory cells.

11. The method of claim 10, wherein said source resistances vary by as much as 10 percent.

12. The method of claim 11, wherein the current capacity of said core memory cells vary with said source resistances.

13. The method of claim 12, wherein a memory cell comprises a transistor.

14. The method of claim 8, wherein said core memory cells are flash memory cells.

15. A method for standard reference cell design:
   determining a first amount of source resistance to be employed in a standard reference cell design based on core memory cells to be measured;
   determining a range of variation due to process variation in the generation of said core memory cells to be measured;
   determining an additional amount of source resistance to be included in said standard reference cell design based on said range of variation; and
   generating a standard reference cell that includes a source resistance equal to the sum of said first and said additional amount of source resistance.

16. The method of claim 15, wherein said variation is caused by differences in an implantation process employed in the manufacture of said core memory cells.

17. The method of claim 16, wherein said variation is caused by a difference in source resistance shown by said core memory cells.

18. The method of claim 17, wherein said source resistance varies by as much as 10 percent.

19. The method of claim 18, wherein the current capacity of said core memory cells varies with said source resistance.

20. The method of claim 19, wherein a memory cell comprises a transistor.

21. The method of claim 15, wherein said memory cells are flash memory cells.

22. A standard reference cell comprising:
   a first number of individual reference cells; and
   an additional number of individual reference cells;
   wherein said first number of individual reference cells correspond to the number of individual memory cells contained in core memory cells to be measured and wherein further said additional number of individual reference cells correspond to a determined range of variation of the source resistances of the core memory cells.

23. The method of claim 22, wherein said variation is caused by differences in an implantation process employed in the manufacture of said core memory cells.

24. The method of claim 23, wherein said source resistances vary by as much as 10 percent.

25. The method of claim 22, wherein said core memory cells are flash memory cells.

26. The method of claim 25, wherein the current capacity of said core memory cells vary with said source resistances.

27. The method of claim 26, wherein an individual reference cell comprises a transistor.

* * * * *